(12) United States Patent
Wada (10) Patent No.: US 11,521,890 B2
(45) Date of Patent: Dec. 6, 2022

(54) APPARATUS FOR MANUFACTURING SEMICONDUCTOR DEVICE

(71) Applicant: SHINKAWA LTD., Tokyo (JP)

(72) Inventor: Shoji Wada, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 648 days.

(21) Appl. No.: 16/622,297

(22) PCT Filed: Mar. 7, 2018

(86) PCT No.: PCT/JP2018/008756
§ 371 (c)(1),
(2) Date: May 11, 2020

(87) PCT Pub. No.: WO2018/164180
PCT Pub. Date: Sep. 13, 2018

(65) Prior Publication Data
US 2020/0273742 A1   Aug. 27, 2020

(30) Foreign Application Priority Data

Mar. 7, 2017  (JP) .............................. JP2017-043131

(51) Int. Cl.
*H01L 21/687* (2006.01)
*H01L 21/67* (2006.01)
(Continued)

(52) U.S. Cl.
CPC .......... *H01L 21/68785* (2013.01); *B23K 3/00* (2013.01); *B29C 65/48* (2013.01);
(Continued)

(58) Field of Classification Search
CPC ......... H01L 21/68785; H01L 21/67109; H01L 21/67248; H01L 21/68; H01L 21/67092;
(Continued)

(56) References Cited

U.S. PATENT DOCUMENTS 4,431,474 A * 2/1984 Gronek ................ B23K 20/025
100/295
5,205,899 A * 4/1993 Woodman, Jr. ....... B29C 65/743
156/515
(Continued)

FOREIGN PATENT DOCUMENTS

DE   102011053498 A1 * 3/2013 ......... C23C 16/4583
JP   H11145264          5/1999
(Continued)

OTHER PUBLICATIONS

"International Search Report (Form PCT/ISA/210) of PCT/JP2018/008756," dated May 1, 2018, with English translation thereof, pp. 1-3.
(Continued)

*Primary Examiner* — Philip C Tucker
*Assistant Examiner* — Brian R Slawski
(74) *Attorney, Agent, or Firm* — JCIPRNET (57) ABSTRACT

An apparatus for manufacturing a semiconductor device includes a base portion, a bonding stage arranged on the base portion and having a placement surface for placing a substrate; and one or more connecting members which connect the base portion and the bonding stage, wherein at least one of the one or more connecting members is a connecting plate that deflects following the expansion and contraction of the bonding stage in the plane direction caused by a temperature change.

8 Claims, 4 Drawing Sheets

(51) Int. Cl.
*B23K 3/00* (2006.01)
*B29C 65/48* (2006.01)
*B29C 45/16* (2006.01)
*B29C 45/14* (2006.01)

(52) U.S. Cl.
CPC .. *H01L 21/67109* (2013.01); *H01L 21/67248* (2013.01); *B29C 2045/14319* (2013.01); *B29C 2045/1659* (2013.01)

(58) Field of Classification Search
CPC ... H01L 21/67288; H01L 21/683; B23K 3/00; B29C 65/48; B29C 65/7802; B29C 2045/14319; B29C 2045/1659; B29C 66/1122; B29C 66/45; B29C 66/452; B29C 66/816; B29C 66/8163; B29C 66/8161; B29C 66/81611
USPC ....... 156/349, 350, 360, 538, 539, 556, 580, 156/583.1; 269/903; 279/128
See application file for complete search history.

(56) References Cited

U.S. PATENT DOCUMENTS

| | | | |
|---|---|---|---|
| 5,507,499 A | 4/1996 | Davenport et al. | |
| 5,511,799 A | 4/1996 | Davenport et al. | |
| 5,673,167 A | 9/1997 | Davenport et al. | |
| 5,735,339 A | 4/1998 | Davenport et al. | |
| 6,190,488 B1 * | 2/2001 | Tada | B32B 37/1009 156/228 |
| 6,509,069 B1 | 1/2003 | Davenport et al. | |
| 2014/0356983 A1 * | 12/2014 | Lin | H01L 21/67092 156/538 |

FOREIGN PATENT DOCUMENTS

| | | | |
|---|---|---|---|
| JP | 3382436 | 3/2003 | |
| JP | 2004158547 | 6/2004 | |
| JP | 2005262358 | 9/2005 | |
| JP | 2007036222 | 2/2007 | |
| JP | 5167072 | 3/2013 | |
| WO | WO-2015156529 A1 * | 10/2015 | ....... H01L 21/67103 |

OTHER PUBLICATIONS

"Written Opinion of the International Searching Authority (Form PCT/ISA/237) of PCT/JP2018/008756," dated May 1, 2018, with English translation thereof, pp. 1-8.

* cited by examiner

APPARATUS FOR MANUFACTURING SEMICONDUCTOR DEVICE

CROSS-REFERENCE TO RELATED APPLICATION

This application is a 371 application of an international PCT application serial no. PCT/JP2018/008756, filed on Mar. 7, 2018, which claims the priority benefit of Japan application JP2017-043131, filed on Mar. 7, 2017. The entirety of the above-mentioned patent application is hereby incorporated by reference herein and made a part of this specification.

BACKGROUND OF THE INVENTION

Technical Field

The present specification discloses an apparatus for manufacturing a semiconductor device which bonds a semiconductor chip to a substrate or another semiconductor chip to manufacture a semiconductor device.

Related Art

A manufacturing apparatus (also referred to as a bonding apparatus) for manufacturing a semiconductor device is equipped with a bonding stage for placing a substrate, and a bonding head which places a semiconductor chip on a substrate or another semiconductor chip arranged on the substrate to perform heating and pressurizing joining. Some apparatus for manufacturing a semiconductor device heat not only a bonding head but also a bonding stage to melt solder or an adhesive arranged on the semiconductor chip.

However, when the bonding stage is heated, the bonding stage is deflected, and flatness is degraded. That is, in the conventional semiconductor device, the bonding stage is often firmly fixed to a base portion of the semiconductor device. In such a case, when the bonding stage is heated, the bonding stage is deflected due to a difference in an amount of thermal expansion between the bonding stage and the base portion, and the flatness of the bonding stage is degraded. If the flatness of the bonding stage was degraded, a distance between the substrate or the like placed on the bonding stage and the bonding head is not kept constant, and the heating and pressurizing joining is not executed well, leading to a degradation of mounting quality.

Therefore, many techniques for increasing the flatness of the bonding stage have been proposed before. For example, Patent Literature 1 discloses an apparatus in which a laser length measuring machine for measuring the heights of a plurality of positions on the bonding stage is arranged, and a tilt adjusting part for adjusting the tilt of the bonding stage on the basis of a measurement result of the laser length measuring machine is arranged. In addition, Patent Literature 2 discloses an apparatus which includes a jack part for adjusting the height of a worktable (a bonding stage), measures the height a plurality of times at regular time intervals, and adjusts the height of the worktable with the jack part so that an average value of the measured values becomes constant.

LITERATURE OF RELATED ART

Patent Literature

[Patent Literature 1] Japanese Patent No. 3382436
[Patent Literature 2] Japanese Patent No. 5167072

SUMMARY

Problems to be Solved

According to such techniques, it is possible to increase parallelism between the bonding stage and the bonding head. However, any of the conventional techniques is a technique for correcting the parallelism precisely when the parallelism is degraded, and is not a technique for suppressing the occurrence of the degradation of flatness. In particular, in the conventional techniques, it was not possible to suppress the occurrence of deflection of the bonding stage caused by a difference in the amount of thermal expansion as described above.

Therefore, the present specification discloses an apparatus for manufacturing a semiconductor device capable of more effectively suppressing the deflection of the bonding stage caused by thermal expansion.

Means to Solve Problems

An apparatus for manufacturing a semiconductor device disclosed in the present specification has a base portion; a bonding stage arranged on the base portion and having a placement surface for placing a substrate; and one or more connecting members which connect the base portion and the bonding stage, in which at least one of the one or more connecting members is a connecting plate which deflects following expansion and contraction of the bonding stage in a plane direction caused by a temperature change.

With such a configuration, it is possible to maintain the connection between the bonding stage and the base portion while allowing the bonding stage to expand and contract in a plane direction. As a result, it is possible to effectively suppress the occurrence of deflection of the bonding stage.

The connecting member may connect the base portion and the bonding stage in a state that the bonding stage is separated from the base portion.

With such a configuration, it is possible to effectively prevent heat from flowing out of the bonding stage to the base portion. As a result, the temperature of the bonding stage can be quickly set to a target temperature, and the influence of heat on the members arranged on the base portion can be reduced.

In addition, the connecting plate may be a plate material which can deflect so that one end in a height direction is displaceable in a thickness direction with respect to the other end, and the connecting plate may be attached to the bonding stage in a posture in which the height direction is substantially orthogonal to the placement surface.

With such a configuration, the connecting plate can more reliably follow the expansion and contraction of the bonding stage in the plane direction.

In addition, a fixing point at which a position with respect to the base portion is invariant regardless of expansion and contraction of the bonding stage caused by the temperature change may be set on the bonding state, and the connecting plate may be attached to the bonding stage in a posture in which a direction from the fixing point toward the connecting plate is substantially parallel to the thickness direction of the connecting plate.

With such a configuration, since the direction of the deflection of the connecting plate and the direction of the expansion and contraction of the bonding stage are aligned, the connecting plate can more reliably follow the expansion and contraction of the bonding stage in the plane direction.

In addition, the fixing point may be set by restricting mutual deflection of two or more connecting plates.

With such a configuration, it is not necessary to arrange a dedicated member for setting the fixing point.

In addition, the base portion may include a base, and a tilt adjusting table which is directly or indirectly installed on the base and in which tilt of an upper surface is adjustable, and the connecting member may connect the tilt adjusting table and the bonding stage.

With such a configuration, it is possible to effectively suppress the occurrence of deflection of the bonding stage while enabling the tilting adjustment of the bonding stage.

In addition, the base portion may include a base, and two or more linear motion mechanisms which are installed directly or indirectly on the base and arranged in parallel at intervals in a specified arrangement direction, in which the linear motion mechanism may have a moving body which moves straight in a moving direction orthogonal to the arrangement direction, and the connecting member may connect the moving body of the linear motion mechanism and the bonding stage.

With such a configuration, it is possible to effectively suppress the occurrence of deflection of the bonding stage while enabling straight movement of the bonding stage.

In this case, the bonding stage may have a fixing point at which a position to the moving body of one linear motion mechanism is invariant regardless of expansion and contraction of the bonding stage caused by a temperature change, and the connecting plate which connects the bonding stage and the moving body of another linear motion mechanism may be attached to the bonding stage in a posture in which a deflection direction of the connecting plate is substantially parallel to the arrangement direction.

With such a configuration, it is possible to reduce the force in the arrangement direction applied to the linear motion mechanism due to the expansion and contraction of the bonding stage, and deterioration and breakage of the linear motion mechanism can be effectively prevented.

Effect

According to the apparatus for manufacturing a semiconductor device disclosed in the present specification, it is possible to maintain the connection between the bonding stage and the base portion while allowing the bonding stage to expand and contract in a plane direction. As a result, it is possible to effectively suppress the occurrence of deflection of the bonding stage.

DESCRIPTION OF THE EMBODIMENTS

Figure 1:
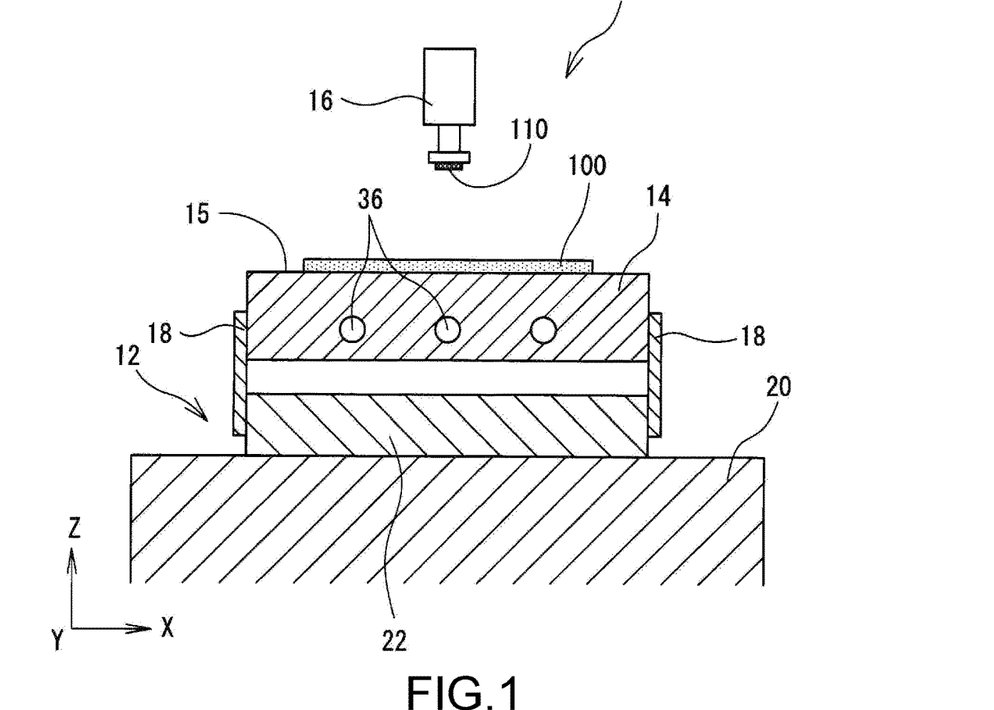
FIG. 1 is a schematic cross-sectional view showing a configuration of an apparatus for manufacturing a semiconductor device.
Figure 2:
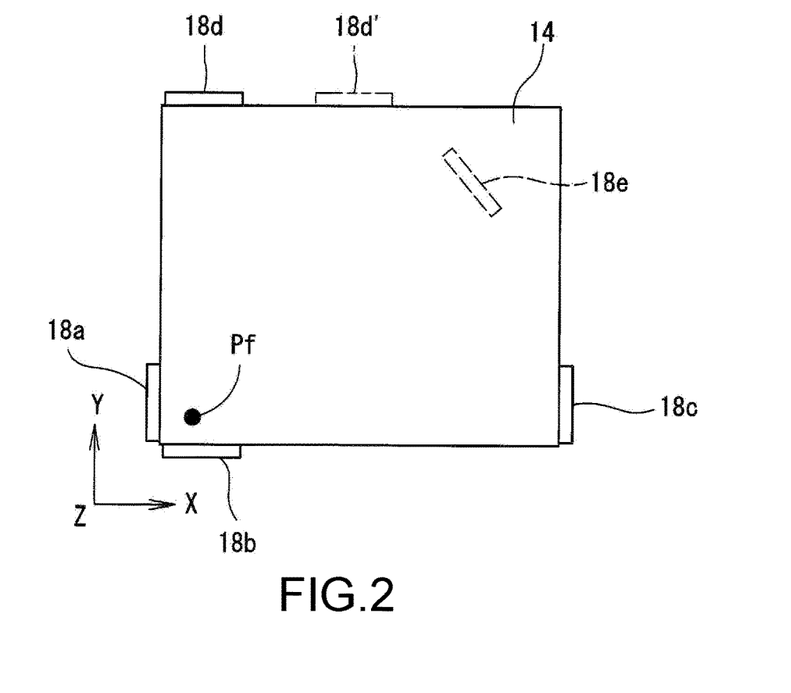
FIG. 2 is a top view of vicinity of a bonding stage.

Hereinafter, an apparatus 10 for manufacturing a semiconductor device is described with reference to the drawings. FIG. 1 is a schematic diagram showing a configuration of the apparatus 10 for manufacturing a semiconductor device. FIG. 2 is a top view of the vicinity of a bonding stage 14 of the manufacturing apparatus 10. The manufacturing apparatus 10 is also called a bonding apparatus, and bonds a semiconductor chip 110 to a substrate 100 or another semiconductor chip 110 arranged on the substrate 100 to manufacture a semiconductor device.

The manufacturing apparatus 10 includes at least a base portion 12, a bonding stage 14, and a bonding head 16. Although the actual manufacturing apparatus 10 also has, in addition to the above components, a substrate supply mechanism which supplies the substrate 100 to the bonding stage 14, a chip supply mechanism which supplies the semiconductor chip 110 to the bonding head 16, and the like, description thereof is omitted.

The base portion 12 is a foundation part on which the bonding stage 14 is installed. As long as it is possible to provide an installation member on which the bonding stage 14 is installed, the configuration of the base portion 12 is not particularly limited, and the base portion 12 may be formed by a single member or a combination of a plurality of members. In the shown example, the base portion 12 includes a base 20, and a tilt adjusting table 22 arranged on the base 20. Although not shown, the base portion 12 is usually equipped with various electronic devices, sensors and the like required for the bonding process.

The tilt adjusting table 22 is a table in which the tilt of an upper surface thereof is changeable. The bonding stage 14 is connected to the tilt adjusting table 22 by a connecting plate 18 described later. Therefore, the tilt of the upper surface of the bonding stage 14 can be adjusted by adjusting the tilt of the tilt adjusting table 22.

Figure 3:
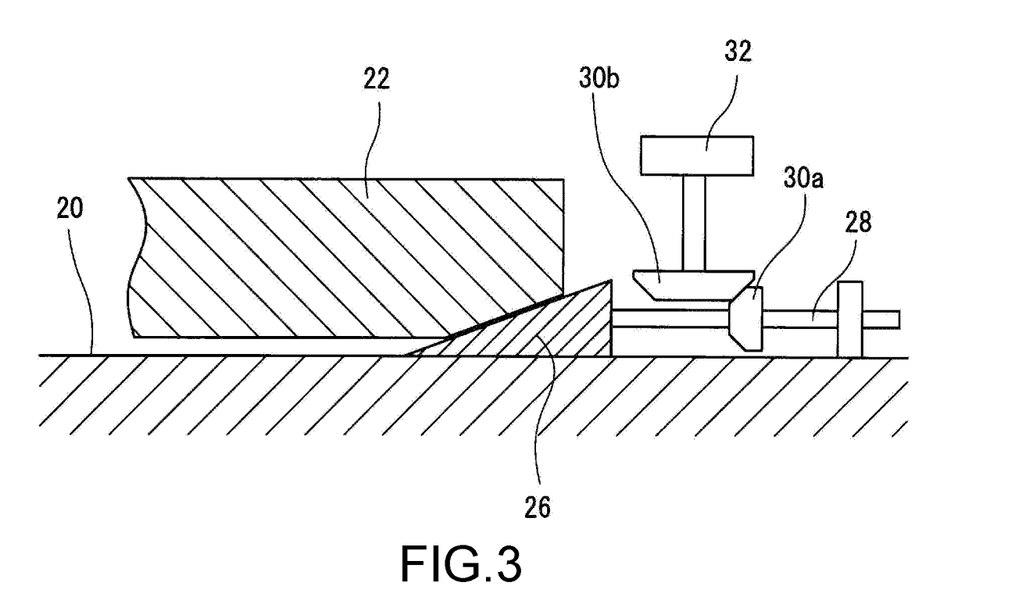
FIG. 3 is a diagram showing a configuration of a tilt adjusting mechanism.

FIG. 3 is a diagram showing an example of the tilt adjusting mechanism for adjusting the tilt of the tilt adjusting table 22. In the shown example, a tapered surface that becomes high toward the outside is formed at a bottom surface end portion of the tilt adjusting table 22. The tilt adjusting mechanism has a wedge member 26 having a tapered surface corresponding to the tapered surface of the tilt adjusting table 22. The wedge member 26 is installed on the base 20, and moves forward and backward in a horizontal direction. The tilt adjusting table 22 is placed on the wedge member 26, and the height of the end portion of the tilt adjusting table 22 and, consequently, the tilt of the upper surface of the tilt adjusting table 22 are adjusted by moving the wedge member forward and backward.

Although the tilt adjusting table 22 is normally pressed and fixed to the wedge member 26 by a lock mechanism (not shown), when the lock mechanism is released, the wedge member 26 can move forward and backward in the horizontal direction. Various mechanisms are considered as a mechanism for moving the wedge member 26 forward and backward, and in the shown example, the rotation of bevel gears 30a and 30b is transmitted to a screw 28 fixed to the wedge member 26 to thereby move the wedge member 26 forward and backward. That is, the screw 28 extending in the horizontal direction (a forward and backward movement direction of the wedge member 26) is fixed to the wedge member 26. The first bevel gear 30a that rotates about a horizontal axis is screwed with the screw 28, and the screw 28 and the wedge member 26 move forward and backward with rotation of the first bevel gear 30a. In addition, the second bevel gear 30b that rotates around a vertical axis meshes with the first bevel gear 30a, and a handle 32 is connected to the second bevel gear 30b via a shaft member extending in the vertical direction. When a user turns the handle 32, the wedge member 26 moves forward and backward, and the tilt of the tilt adjusting table 22 changes.

Moreover, the tilt adjusting mechanism described here is an example, and as long as it is possible to adjust the tilt of the upper surface of the tilt adjusting table 22, other configurations may be adopted. For example, jacks for raising and lowering the tilt adjusting table 22 may be arranged at a plurality of locations (for example, three locations). In addition, the tilt adjusting table 22 may be placed directly on the base 20, or may be placed via another member, for example, an X-Y moving table or the like.

The configuration of the manufacturing apparatus 10 is described with reference to to FIG. 1 and FIG. 2 again. The bonding stage 14 is arranged above the base portion 12, more specifically, above the tilt adjusting table 22. The bonding stage 14 is a base member for placing a substrate 100, and an upper surface of the bonding stage 14 serves as a placement surface 15 for placing a substrate 100. A suction mechanism (not shown) which sucks and holds the substrate 100 is built in the bonding stage 14. In addition, a heater 36 for heating the substrate 100 is also built in the bonding stage 14. Heat of the heater 36 is transferred to the substrate 100 via the bonding stage 14.

The bonding head 16 is arranged directly above the placement surface 15. The bonding head 16 places the semiconductor chip 110 sucked and held at a front end portion on the substrate 100 or another semiconductor chip 110 arranged on the substrate 100, and heats and presses the semiconductor chip 110. Thereby, the solder or the adhesive arranged on the semiconductor chip 110 is melted and hardened, and the semiconductor chip 110 is fixed (bonded) to the substrate 100 or another semiconductor chip 110. Since a known technique can be used as a configuration of the bonding head 16, detailed description thereof is omitted.

Here, as shown in FIG. 1, in the manufacturing apparatus 10 disclosed in this specification, the bonding stage 14 is connected to the tilt adjusting table 22 (the base portion 12) by using a substantially flat plate-shaped connecting plate 18. The connecting plate 18 functions as a connecting member that connects the base portion 12 and the bonding stage 14.

The connecting plate 18 is a substantially rectangular flat plate made of stainless steel or the like. Since the thickness of the connecting plate 18 is sufficiently smaller than the height, one end in the height direction can deflect (elastically displace) to be displaced in the thickness direction with respect to the other end.

As shown in FIG. 1, each connecting plate 18 has one end in the height direction fixed to a side surface of the bonding stage 14, and the other end in the height direction fixed to the side surface of the tilt adjusting table 22. Therefore, the connecting plate 18 is attached to the bonding stage 14 in a posture in which its height direction is substantially orthogonal to the placement surface 15.

As shown in FIG. 1, the connecting plate 18 connects the bonding stage 14 and the tilt adjusting table 22, in a state of separating the bonding stage 14 from the tilt adjusting table 22 (the base portion 12). As a result, there is no contact portion between the bonding stage 14 and the tilt adjusting table 22. In addition, an air layer functioning as a heat insulating layer is formed between the bonding stage 14 and the tilt adjusting table 22.

The number and arrangement of the connecting plate 18 are not particularly limited as long as sufficient rigidity can be ensured. In this example, as shown in FIG. 2, the bonding stage 14 and the base portion 12 are connected using five connection plates 18.

The reason for connecting the bonding stage 14 and the base portion 12 using the aforementioned connecting plate 18 is described. As described above, the heater 36 for heating the substrate 100 is built in the bonding stage 14. It is known that the bonding stage 14 expands due to the heat of the heater 36. On the other hand, the base portion 12 has a heat capacity greater than that of the bonding stage 14 and the temperature of the base portion 12 is hard to rise. In addition, the base portion 12 often has a material different from that of the bonding stage 14, and often has a different coefficient of thermal expansion. Therefore, when the heater 36 is operated, the amount of thermal expansion of the bonding stage 14 is often larger than the amount of thermal expansion of the base portion 12.

Figure 8:
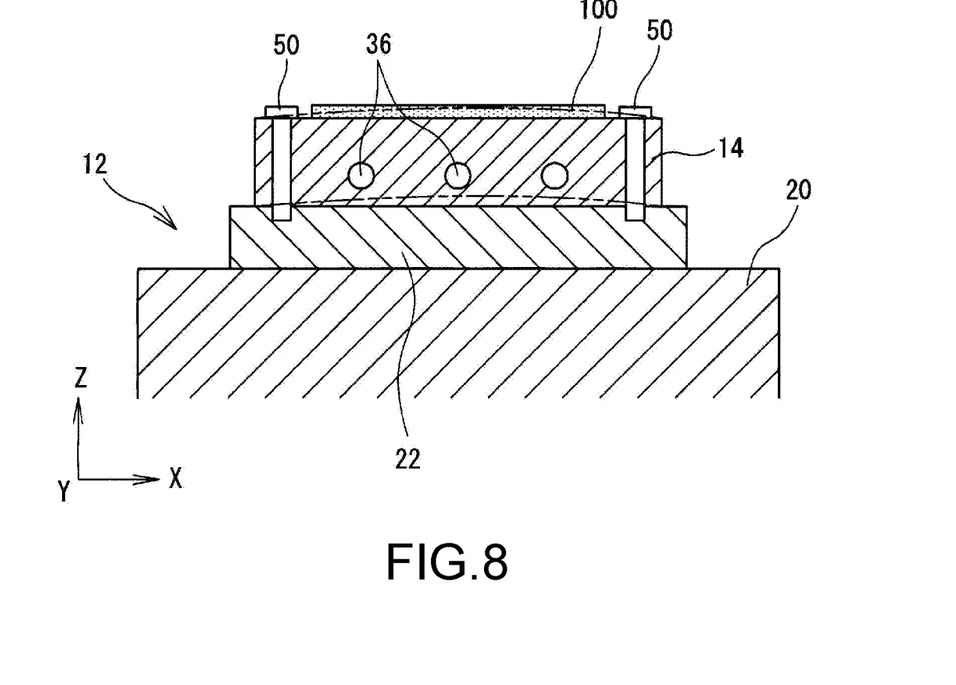
FIG. 8 is a diagram showing a state in which a bonding stage and a base portion are firmly connected.

Here, as shown in FIG. 8, a case in which both ends of the bonding stage 14 are firmly fixed to the base portion 12 (the tilt adjusting table 22) by using bolts 50 is considered. In this case, the amount of expansion of the bonding stage 14 in the plane direction is larger than the amount of expansion of the base portion 12 in the plane direction. On the other hand, both ends of the bonding stage 14 are fixed to the base portion 12, and the positions with respect to the base portion 12 do not change. Therefore, since the bonding stage 14 cannot be displaced even during thermal expansion, it warps (deflects) correspondingly as shown by a two-dot chain line. In this way, when the bonding stage 14 warps, flatness of the bonding stage 14 and consequently the substrate 100 placed on the bonding stage 14 is degraded. In addition, when the flatness of the substrate 100 is degraded, the distance between the substrate 100 and the bonding head 16 is not kept constant, and the bonding is not executed well, leading to degradation of the mounting quality.

In addition, as shown in FIG. 8, when the bonding stage 14 is directly placed on the base portion 12 (the tilt adjusting table 22), the heat of the heater 36 easily flows out to the base portion 12. Here, the base portion 12 has a heat capacity greater than that of the bonding stage 14. When the heat flows out to the base portion 12 having a large heat capacity, it takes time for the bonding stage 14 to reach a target temperature accordingly. As a result, the time required for the temperature of the bonding stage 14 to stabilize becomes longer, and the time required for bonding becomes longer. In addition, when the heat flows out to the base portion 12, other members arranged on the base portion 12, for example, the tilt adjusting table 22, the sensor and the like are also affected by the heat, which is not desirable.

Therefore, in the manufacturing apparatus 10 disclosed in this specification, the bonding stage 14 is connected to the tilt adjusting table 22 (the base portion 12) by using the connecting plate 18 capable of deflecting. Since the connecting plate 18 is attached in a posture in which the height direction thereof is substantially orthogonal to the placement surface 15, when the bonding stage 14 expands or contracts in the plane direction due to a temperature change, the connecting plate 18 can deflect following the expansion or contraction.

Figure 4:
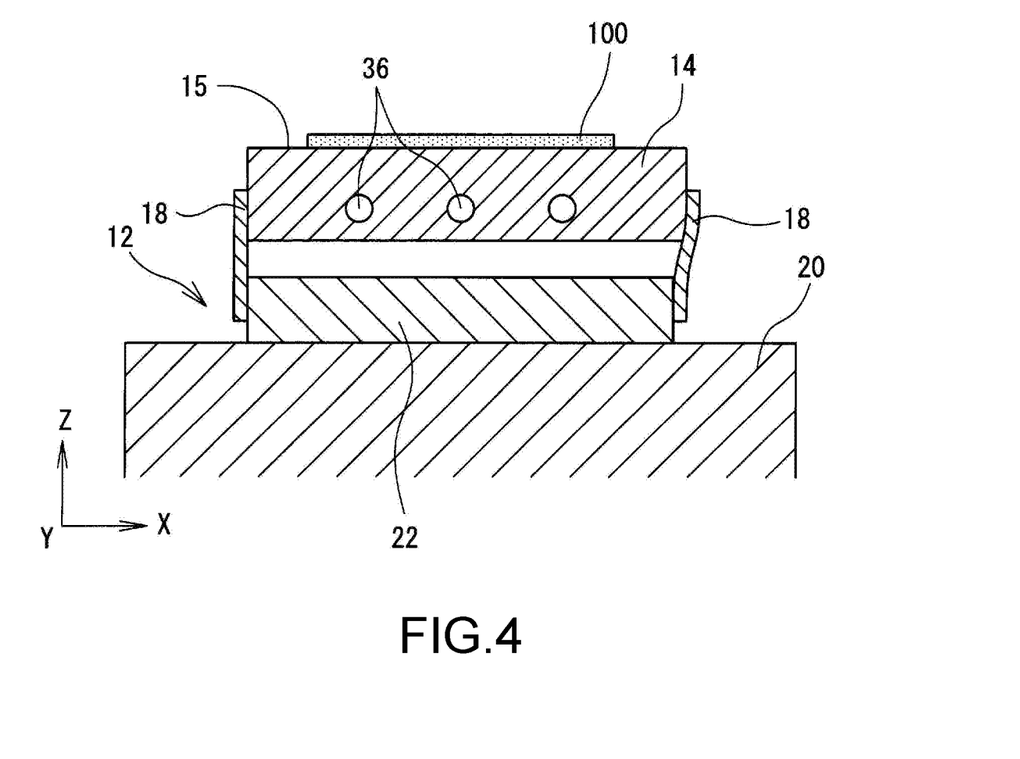
FIG. 4 is a diagram showing a state when a bonding stage expands.

FIG. 4 is an image diagram showing a state in which the bonding stage 14 is heated and expanded. As shown in FIG. 4, the bonding stage 14 is assumed to expand in the plane direction due to the heat of the heater 36. At this time, the connecting plate 18 deflects so that its upper end in the height direction is displaced outward in the plane direction following the expansion of the bonding stage 14. Thereby, the bonding stage 14 is allowed to expand while the connection between the bonding stage 14 and the base portion 12 is maintained. As a result, the warpage of the bonding stage 14 is suppressed, and degradation of flatness of the placement surface 15 is suppressed.

Meanwhile, the bonding stage 14 receives a force from the bonding head 16 in a direction (a load direction, a Z direction) orthogonal to the placement surface 15. The bonding stage 14 is required to have high rigidity in the load direction so as not to be tilted even when receiving the force in the load direction. Although the connecting plate 18 deflects when receiving a force in the thickness direction due to its shape, it hardly deforms even when receiving a force in the height direction (=load direction). Therefore, the rigidity of the bonding stage 14 in the load direction can be kept high by using the connecting plate 18 to connect the bonding stage 14 to the base portion 12.

In addition, as described above, the connecting plate 18 connects the bonding stage 14 and the tilt adjusting table 22 in the state of separating the bonding stage 14 from the tilt adjusting table 22. With such a configuration, a contact area between the bonding stage 14 and the tilt adjusting table 22 can be reduced, and an air layer functioning as a heat insulating layer can be formed between them. As a result, it is possible to suppress the heat of the heater 36 from flowing out to the base portion 12. When the heat outflow to the base portion 12 is suppressed, the bonding stage 14 can quickly reach the target temperature, and the time required for bonding can be reduced. In addition, the influence of the heat on the base portion 12 can be reduced, and more stable operation can be performed. Furthermore, since the heat outflow to the base portion 12 can be suppressed, the bonding stage can be kept at a uniform temperature.

Meanwhile, depending on the arrangement form of the connecting plate 18, in the bonding stage 14, a fixing point Pf is set on which a position to the base portion 12 does not change regardless of expansion and contraction of the bonding stage 14 caused by a temperature change. For example, as shown in FIG. 2, when two connecting plates 18a and 18b are attached to the vicinity of one corner of the bonding stage 14 so that their thickness directions are substantially orthogonal to each other, the vicinity of the one corner becomes the fixing point Pf. That is, in this case, the displacement of the fixing point Pf in the X direction is restricted by the connecting plate 18b attached to the end surface in the Y direction, and the displacement of the fixing point Pf in the Y direction is restricted by the connecting plate 18a attached to the end surface in the X direction. In other words, the two connecting plates 18a and 18b restrict the deflection of each other, and thereby the fixing point Pf that does not displace with respect to the base portion 12 is set on the bonding stage 14.

Since the bonding stage 14 expands and contracts on the basis of such a fixing point Pf, it is desirable that the connecting plate 18 is attached to the bonding stage 14 in a posture in which the distance to the fixing point Pf is changeable. Specifically, it is desirable that each connecting plate 18 is attached to the bonding stage 14 in a posture in which the direction from the fixing point Pf toward the connecting plate 18 is substantially parallel to the thickness direction of the connecting plate 18.

In the example of FIG. 2, since the connecting plate 18c is located in the X direction as viewed from the fixing point Pf, the connecting plate 18c is attached in a posture in which its thickness direction (displacement direction determined by deflection) is substantially parallel to the X direction. In addition, since the connecting plate 18d is located in the Y direction as viewed from the fixing point Pf, the connecting plate 18d is attached in a posture in which its thickness direction (displacement direction determined by deflection) is substantially parallel to the Y direction. Furthermore, since the connecting plate 18e is located in a diagonal direction as viewed from the fixing point Pf, the connecting plate 18e is attached in a posture in which its thickness direction (displacement direction determined by deflection) is substantially parallel to the diagonal direction.

However, as long as the thickness direction (displacement direction determined by deflection) of the connecting plate 18 is not substantially perpendicular to the direction from the fixing point Pf toward the connecting plate 18, the thickness direction may not necessarily be parallel to the latter direction. For example, in the example of FIG. 2, the connecting plate 18d may be attached to a position shifted in the X direction, that is, a position indicated by reference numeral 18d' in FIG. 2.

Figure 5:
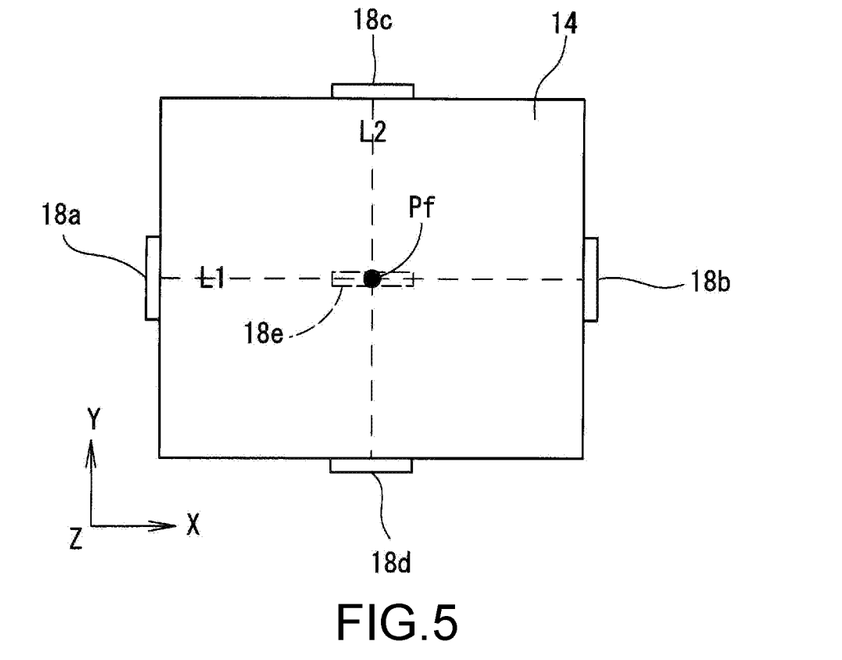
FIG. 5 is a diagram showing another arrangement example of a connecting plate.

In any case, as long as the connecting plate 18 does not restrict the expansion and contraction of the bonding stage 14, the arrangement and the number of the connecting plate 18 may be appropriately changed. Therefore, the connecting plate 18 may be disposed as shown in FIG. 5. In the example of FIG. 5, two connecting plates 18a and 18b are disposed on both end surfaces of the bonding stage 14 in the X direction in a posture in which their thickness direction is substantially parallel to the X direction. In addition, two connecting plates 18c and 18d are disposed on both end surfaces of the bonding stage 14 in the Y direction in a posture in which their thickness direction is substantially parallel to the Y direction. In this case, an intersection between a straight line L1 for connecting the two connecting plates 18a and 18b facing in the X direction and a straight line L2 for connecting the two connecting plates 18c and 18d facing in the Y direction becomes the fixing point Pf that is invariant in position with respect to the base portion 12. In the example of FIG. 5, a connecting plate 18e is also arranged near the fixing point Pf to secure rigidity in the load direction.

As is evident from the above description, depending on the arrangement form of the connecting plate 18, the fixing point Pf that is invariant in position with respect to the base portion 12 can be set on the bonding stage 14. Such a fixing point Pf is convenient when handling a transparent substrate or the like. That is, in the case of a transparent substrate, a positioning mark is arranged on the placement surface 15 of the bonding stage 14. Then, the positioning of the semiconductor chip 110 may be performed on the basis of the positioning mark that is visually recognizable through the transparent substrate. When the bonding stage 14 thermally expands, the positioning mark attached to the bonding stage 14 is also deformed. If the fixing point Pf is not set, deformation of the positioning mark caused by the thermal expansion cannot be predicted, and accurate positioning becomes difficult. On the other hand, if the fixing point Pf is set, it is possible to predict the direction and the amount of the deformation of the positioning mark caused by the thermal expansion of the bonding stage 14, and appropriate positioning can be performed. In addition, by placing the substrate 100 on the bonding stage 14 on the basis of the connecting plates 18a and 18b or the fixing point Pf, the substrate 100 can be precisely positioned on the bonding stage 14.

In any case, as is apparent from the above description, by using the connecting plate 18 capable of deflecting to connect the bonding stage 14 and the base portion 12 to each other, the warpage of the bonding stage 14 due to thermal expansion can be suppressed, and degradation of flatness of the placed substrate 100 or the like can be suppressed. As a result, the bonding quality can be further improved.

Moreover, in the above description, all the connecting members that connect the bonding stage 14 and the base portion 12 are the connecting plates 18 capable of deflecting; however, some of the connecting members may be a rigid body that is hard to deflect. For example, in FIG. 2, a rigid body that is hard to deflect may be used as the connecting member arranged near the fixing point Pf, instead of the connecting plates 18a and 18b. In addition, in the example of FIG. 5, the connecting plate 18e arranged at the fixing point Pf may be replaced with a rigid body that is hard to deflect.

Figure 6:
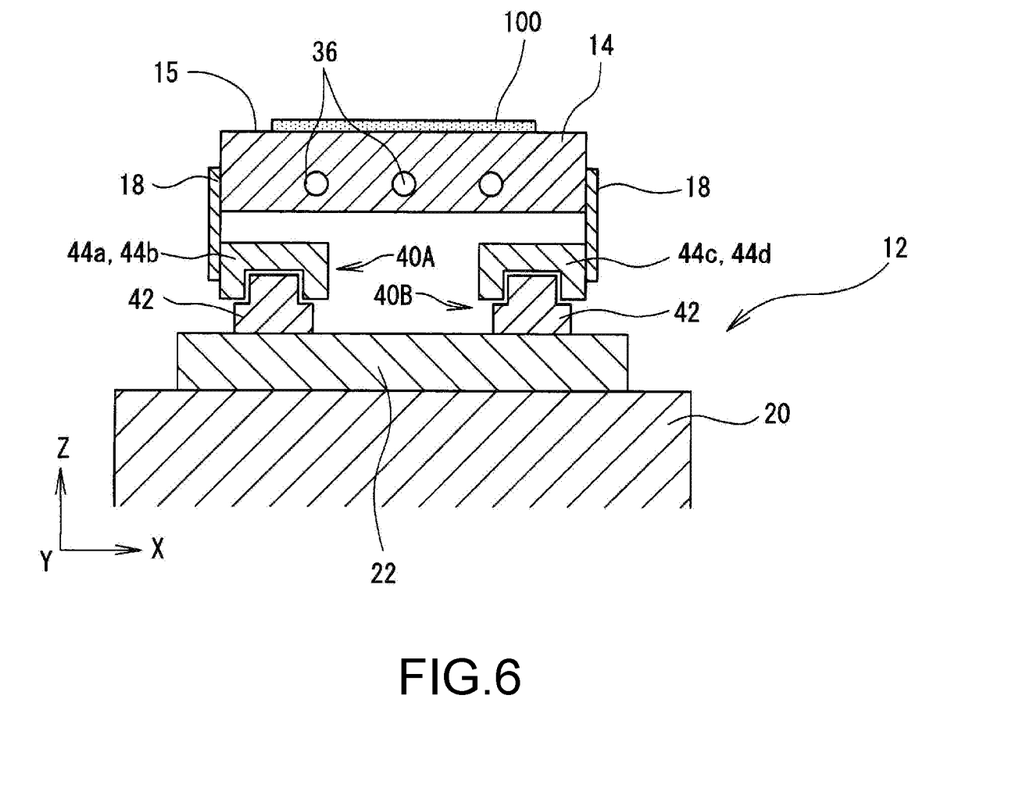
FIG. 6 is a cross-sectional view of vicinity of a bonding stage in another manufacturing apparatus.

Next, another example of the apparatus 10 for manufacturing a semiconductor device is described with reference to FIG. 6 and FIG. 7. FIG. 6 is a schematic cross-sectional view of the vicinity of the bonding stage 14 of another manufacturing apparatus 10, and FIG. 7 is a top view of the vicinity of the bonding stage 14.

The base portion 12 of the manufacturing apparatus 10 further includes two linear motion mechanisms 40A and 40B in addition to the base 20 and the tilt adjusting table 22. The two linear motion mechanisms 40A and 40B are arranged in parallel above the tilt adjusting table 22 at intervals in a specified arrangement direction (for example, the X direction). The first linear motion mechanism 40A is equipped with a rail 42 extending in a moving direction (for example, the Y direction) orthogonal to the arrangement direction, and two moving bodies 44a and 44b. The second linear motion mechanism 40B is equipped with a rail 42 extending in the moving direction and two moving bodies 44c.

Four corners of the bonding stage 14 are connected to the four moving bodies 44a to 44d, and the bonding stage 14 also moves straight in the moving direction along with the straight movement of the moving bodies 44a to 44d. Here, the expansion of the bonding stage 14 in the moving direction (the Y direction) can be absorbed when the two moving bodies 44a and 44b or 44c and 44d arranged in the moving direction move in the moving direction. On the other hand, the expansion of the bonding stage 14 in the arrangement direction (X direction) cannot be absorbed by the movement of the moving bodies 44a to 44d. Therefore, when the bonding stage 14 is firmly connected to the moving bodies 44a to 44d, the load in the X direction is applied to the two linear motion mechanisms 40A and 40B along with expansion of the bonding stage 14 in the X direction (arrangement direction), which causes deterioration or breakage of the linear motion mechanisms 40A and 40B.

Figure 7:
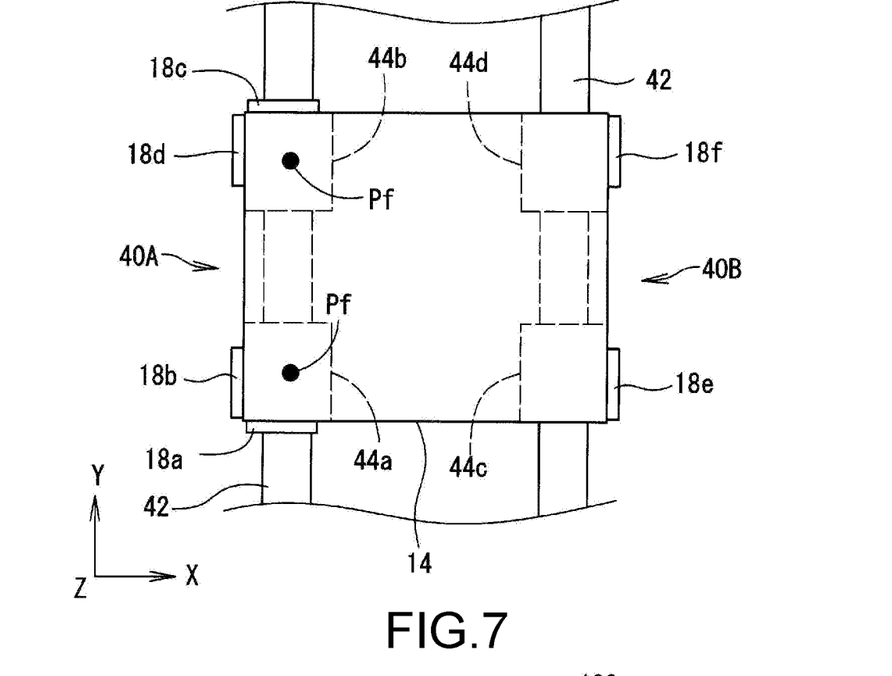
FIG. 7 is a cross-sectional view of vicinity of a bonding stage in another manufacturing apparatus.

Therefore, in the manufacturing apparatus 10 shown in FIG. 6 and FIG. 7, the bonding stage 14 and the moving bodies 44a to 44d (the base portion 12) are connected by the connecting plate 18 capable of deflecting. More specifically, the moving body 44a of the first linear motion mechanism 40A and the bonding stage 14 are connected by two connecting plates 18a and 18b arranged in a substantially L shape. In this case, since the deformation of the two connecting plates 18a and 18b is mutually restricted, the vicinity of the two connecting plates 18a and 18b serves as the fixing point Pf that is invariant in position with respect to the moving body 44a (the base portion 12). Similarly, the moving body 44b of the first linear motion mechanism 40A and the bonding stage 14 are also connected by two connecting plates 18c and 18d arranged in a substantially L-shape, and the fixing point Pf that is invariant with respect to the moving body 44b (the base portion 12) is set in the vicinity of the two connecting plates 18c and 18d.

The moving bodies 44c and 44d of the second linear motion mechanism 40B located at a position separated from the fixing point Pf in the X direction is connected to the bonding stage 14 via the connecting plates 18e and 18f of a posture in which the thickness direction is substantially parallel to the X direction (the arrangement direction). When the bonding stage 14 expands in the X direction on the basis of the fixing point Pf, only the upper ends of the connecting plates 18e and 18f fixed to the bonding stage 14 are displaced in the X direction following the expansion. On the other hand, the lower ends of the connecting plates 18e and 18f fixed to the moving bodies 44c and 44d deflect so as not to be displaced. As a result, when the bonding stage 14 expands in the X direction, since the load in the X direction applied to the second linear motion mechanism 40B is greatly reduced, the deterioration and breakage of the second linear motion mechanism 40B can be effectively prevented.

Moreover, in the examples shown in FIG. 6 and FIG. 7, the number of linear motion mechanisms arranged in parallel is set to two; however, a larger number of linear motion mechanisms may be arranged. For example, three linear motion mechanisms arranged in parallel in a specified arrangement direction may be arranged. In this case, the bonding stage 14 is connected so that the position is invariant with respect to the moving body of one linear moving mechanism, and is connected to the moving bodies of the remaining two linear moving mechanisms via the connecting plate 18 so as to be displaceable in the arrangement direction.

In addition, in the above description, all the connecting plates 18 have a flat plate shape with no bending; however, as long as the connecting plate 18 can deflect so that one end in the height direction is displaced in the thickness direction with respect to the other end, the connecting plate 18 may be a substantially L-shaped or substantially U-shaped sheet metal plate that bends in the middle.

In addition, the configuration in which the bonding stage 14 is connected to the tilt adjusting table 22 or the moving bodies 44a to 44d of the linear motion mechanisms 40A and 40B has been described above as an example; however, as long as the bonding stage 14 is a member arranged on the base portion 12, it may be connected to any member. Therefore, the bonding stage 14 may be connected via the connecting member to the base 20 that neither tilts nor moves. In addition, as long as at least one of the connecting members for connecting the bonding stage 14 and the base portion 12 is arranged as the connecting plate 18 which deflects following the expansion and contraction of the bonding stage 14 in the plane direction caused by a temperature change, other configurations may be changed as appropriate, without being limited to above description.

What is claimed is:

1. An apparatus for manufacturing a semiconductor device, comprising:
   a base portion;
   a bonding stage arranged on the base portion and having a placement surface for placing a substrate; and
   one or more connecting members which connect the base portion and the bonding stage, wherein at least one of the one or more connecting members is a connecting plate which deflects following expansion and contraction of the bonding stage in a plane direction caused by a temperature change.

2. The apparatus for manufacturing a semiconductor device according to claim 1, wherein the one or more connecting members connect the base portion and the bonding stage in a state that the bonding stage is separated from the base portion.

3. The apparatus for manufacturing a semiconductor device according to claim 1, wherein the at least one connecting plate is a plate material which can deflect so that one end in a height direction is displaceable in a thickness direction with respect to the other end, and the at least one connecting plate is attached to the bonding stage in a posture in which the height direction is substantially orthogonal to the placement surface.

4. The apparatus for manufacturing a semiconductor device according to claim 3, wherein a fixing point at which a position with respect to the base portion is invariant regardless of expansion and contraction of the bonding stage caused by the temperature change is set on the bonding stage, and the connecting plate is attached to the bonding stage in a posture in which a direction from the fixing point toward the connecting plate is substantially parallel to the thickness direction of the connecting plate.

5. The apparatus for manufacturing a semiconductor device according to claim 4, wherein the fixing point is set by the connecting plate and at least one additional connecting plate restricting deflection of each other.

6. The apparatus for manufacturing a semiconductor device according to claim 1, wherein the base portion includes:

a base, and a tilt adjusting table which is directly or indirectly installed on the base and in which tilt of an upper surface is adjustable, and the one or more connecting members connect the tilt adjusting table and the bonding stage.

7. The apparatus for manufacturing a semiconductor device according to claim 1, wherein the base portion includes:

a base, and two or more linear motion mechanisms which are installed directly or indirectly on the base and arranged in parallel at intervals in a specified arrangement direction, wherein each linear motion mechanism has a moving body which moves straight a moving direction orthogonal to the arrangement direction, and the one or more connecting members connect the moving bodies of the linear motion mechanisms and the bonding stage.

8. The apparatus for manufacturing a semiconductor device according to claim 7, wherein the bonding stage has a fixing point at which a position to the moving body of one linear motion mechanism is invariant regardless of expansion and contraction of the bonding stage caused by the temperature change, and the connecting plate which connects the bonding stage and the moving body of another linear motion mechanism is attached to the bonding stage in a posture in which a deflection direction of the connecting plate is substantially parallel to the arrangement direction.

* * * * *